United States Patent [19]

Kudou et al.

[11] Patent Number: 5,173,626
[45] Date of Patent: Dec. 22, 1992

[54] FLIP-FLOP WITH SCAN PATH

[75] Inventors: Tsuneaki Kudou; Naoko Nakamura, both of Yokohama, Japan

[73] Assignee: Kabushiki Kaisha Toshiba, Kawasaki, Japan

[21] Appl. No.: 712,541

[22] Filed: Jun. 10, 1991

[30] Foreign Application Priority Data

Jun. 25, 1990 [JP] Japan ................... 2-164230

[51] Int. Cl.$^5$ ................... G11C 19/28; H03K 19/096
[52] U.S. Cl. ................... 307/481; 307/272.2; 307/291; 307/452
[58] Field of Search ................ 307/481, 272.2, 272.1, 307/451, 452, 453, 291

[56] References Cited

U.S. PATENT DOCUMENTS

| 4,495,628 | 1/1985 | Zasio et al. | 307/272.2 |
| 4,495,629 | 1/1985 | Zasio et al. | 307/272.2 |
| 4,540,903 | 9/1985 | Cooke et al. | 307/272.2 |
| 4,806,786 | 2/1989 | Valentine | 307/272.1 |
| 5,015,875 | 5/1991 | Giles et al. | 307/272.2 |
| 5,041,742 | 8/1991 | Carbonaro | 307/453 |

Primary Examiner—Edward P. Westin
Assistant Examiner—Richard Roseen
Attorney, Agent, or Firm—Foley & Lardner

[57] ABSTRACT

An improved flip-flop with a scan path comprises a front page circuit driven in response to a clock signal and multiplexers for receiving a data signal and a scan test signal. Each of the multiplexers comprises a single stage of FETs connected in series between a power source and a ground. This arrangement can remarkably improve an operation frequency.

9 Claims, 3 Drawing Sheets

FIG.1
PRIOR ART
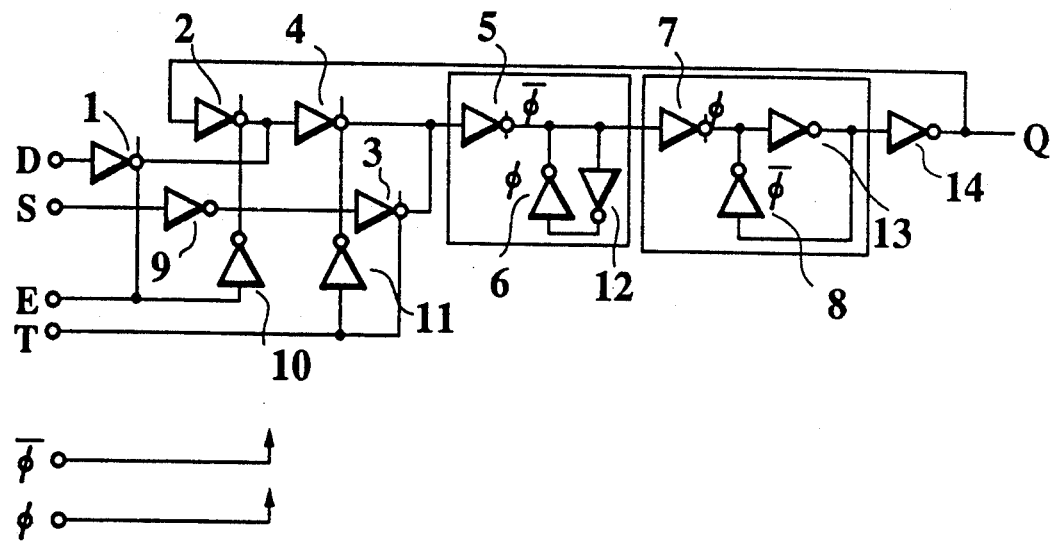
FIG.2A
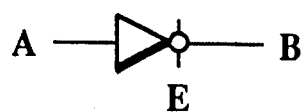
FIG.2B
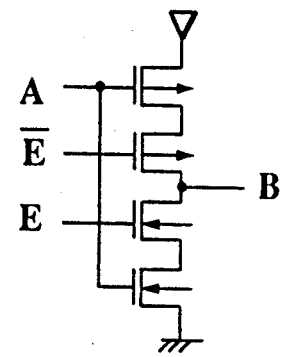
FIG.2C
| A | E | B |
|---|---|---|
| 0 | 0 | * |
| 1 | 0 | * |
| 0 | 1 | 1 |
| 1 | 1 | 0 |
* → HIGH IMPEDANCE STATE

FLIP-FLOP WITH SCAN PATH

BACKGROUND OF THE INVENTION

1. Field of the Invention

The present invention relates to a flip-flop with a scan path function that can shorten a setup time to achieve a high-speed operation, and particularly to a flip-flop with a scan path function employed for higher speed microprocessors.

2. Description of the Prior Art

As LSIs are more integrated year after year, conventional techniques hardly test these LSIs. To cope with this, some measures are needed. As one of the measures, a flip-flop (F/F) with a scan path has been proposed.

FIG. 1 shows a conventional F/F circuit with a scan path. In the figure, reference marks $\phi$ and $\bar{\phi}$ denote a clock pulse signal and an inverted clock pulse signal respectively, D a data input terminal, S a test data input terminal, E an enable signal terminal and T a test enable signal terminal.

FIGS. 2(A) and 2(B) show signals of a clocked inverter which is activated with E=1, and a corresponding circuit diagram. FIG. 2(C) is a truth table of the signals. To activate the clocked inverter with E=0, the signals E and $\bar{E}$ of FIG. 2(B) may be replaced with each other, and 0s and 1s for the E of FIG. 2(C) may be replaced with each other. In the table of FIG. 2(C), "*" denotes a high impedance state.

The contents of a conventional F/F which is arranged in a circuit are usually influenced by logic circuits on the downstream side of the F/F and, therefore, hardly observed as they are. In addition, an output value of the F/F fed back to a combinational circuit indicates a previous value, so that the F/F has poor controllability and requires a large number of input vectors.

On the other hand, the F/F with a scan path is easy to monitor, and its output may optionally be set irrespective of the previous state, thereby enabling a sequential circuit to be tested as a combinational circuit.

The F/F of FIG. 1 is of a master-slave type whose data input portion controls a scan path test.

An operation of an edge trigger master-slave flip-flop (F/F) will be explained with reference to a circuit diagram of FIG. 3(A) and a timing chart of FIG. 3(B).

Unlike the F/F of FIG. 1, the F/F of FIG. 3(A) has complimentary outputs. The F/F of FIG. 3(A) comprises a master circuit MF/F for receiving data, and a slave circuit SF/F for holding the data. In synchronism of edges of a clock signal, input data D of the F/F is established, and an output data of the F/F changes. When the master F/F receives data, the slave F/F holds and outputs data of a previous cycle. When a data incoming portion 15 of the master F/F closes, a data incoming portion 17 of the slave F/F opens to receive data from the master F/F and update output data.

A test enabled state of the F/F with a scan path of FIG. 1 will be explained.

Input data passes through two clocked inverters comprising a multiplexer for scan input and a multiplexer for data feedback. The input data passes three stages of clocked inverters until it enters the master F/F. A setup time of the F/F, therefore, involves a delay time produced by the three stages of clocked inverters.

The delay of the three stages of clocked inverters prevents the F/F from improving its operation speed. There are many gates the input data has to pass through until the data enters the master F/F, and these gates delay the setup time which must be very short for speeding up data input, thereby preventing an improvement of operation frequency. In addition, the multiplexers interposed before the F/F increase a cell area, thereby enlarging the size of the F/F.

To solve these problems, the present invention provides a flip-flop with a scan path, which realizes a short input setup time, a high-speed operation, and compactness.

SUMMARY OF THE INVENTION

An object of the invention is to provide a high-speed flip-flop with a scan path.

Another object of the invention is to provide a flip-flop with a scan path having a small number of gates.

Still another object of the invention is to provide a flip-flop with a scan path having a short setup time.

To accomplish the objects, the invention provides a flip-flop with a scan path comprising a latch circuit which is a combinational circuit of an inverter and a clocked inverter whose inputs and outputs are connected to each other to form a closed loop; three first MOSFETs connected in series between a power source terminal and an input terminal of the inverter of the combinational circuit, gate terminals of the three first MOSFETs being connected to a data terminal, one of a clock signal terminal and an inverted clock signal terminal, and one of a test enable signal terminal and an inverted test enable signal terminal, respectively; three second MOSFETs connected in series between a ground terminal and the input terminal of the inverter of the combinational circuit, gate terminals of the three second MOSFETs being connected to the data terminal, the other of the clock signal terminal and inverted clock signal terminal, and the other of the test enable signal terminal and inverted test enable signal terminal, respectively; three third MOSFETs connected in series between the power source terminal and the input terminal of the inverter of the combinational circuit, gate terminals of the three third MOSFETs being connected to a test scan terminal, one of the clock signal terminal and inverted clock signal terminal, and one of the test enable signal terminal and inverted test enable signal terminal, respectively; and three fourth MOSFETs connected in series between the ground terminal and the input terminal of the inverter of the combinational circuit, gate terminals of the three forth MOSFETs being connected to the test scan terminal, the other of the clock signal terminal and inverted clock signal terminal, and the other of the test enable signal terminal and inverted test enable signal terminal, respectively. The channel types of the first, second, third and fourth MOSFETs, and connections between the gate terminals of the first, second, third and fourth MOSFETs and the test enable terminal, clock terminal, inverted test enable terminal, inverted clock terminal test scan terminal and data terminal are set such that a test scan signal is supplied to the latch circuit when the test enable signal terminal is active, and a data signal is supplied to the latch circuit when the test enable signal terminal is not active.

This arrangement can reduce the number of gates from three to one, thereby reducing the setup time. With the number of series-connected transistors being increased, more sources and drains of the transistors commonly be used in layout designing, thereby reducing a cell area. In this way, the invention provides a highly integrated flip-flop which realizes a short setup time.

BRIEF DESCRIPTION OF THE DRAWINGS

FIG. 1 is a circuit diagram showing a flip-flop with a scan path according to a prior art;

FIGS. 2(A), 2(B) and 2(C) are views showing reference marks, circuit diagrams and a truth table of a clocked inverter;

DETAILED DESCRIPTION OF THE EMBODIMENTS

Figure 3A:
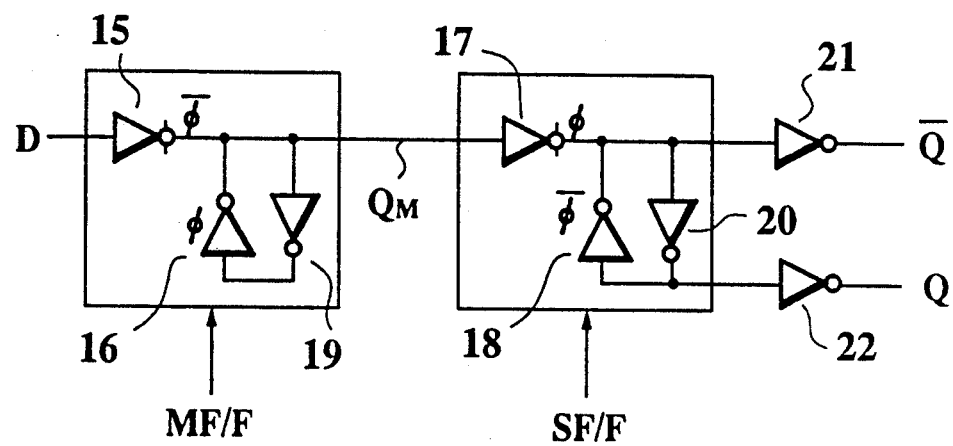
FIGS. 3(A) and 3(B) are a circuit diagram and a timing chart explaining an operation of a master-slave type flip-flop.
Figure 3B:
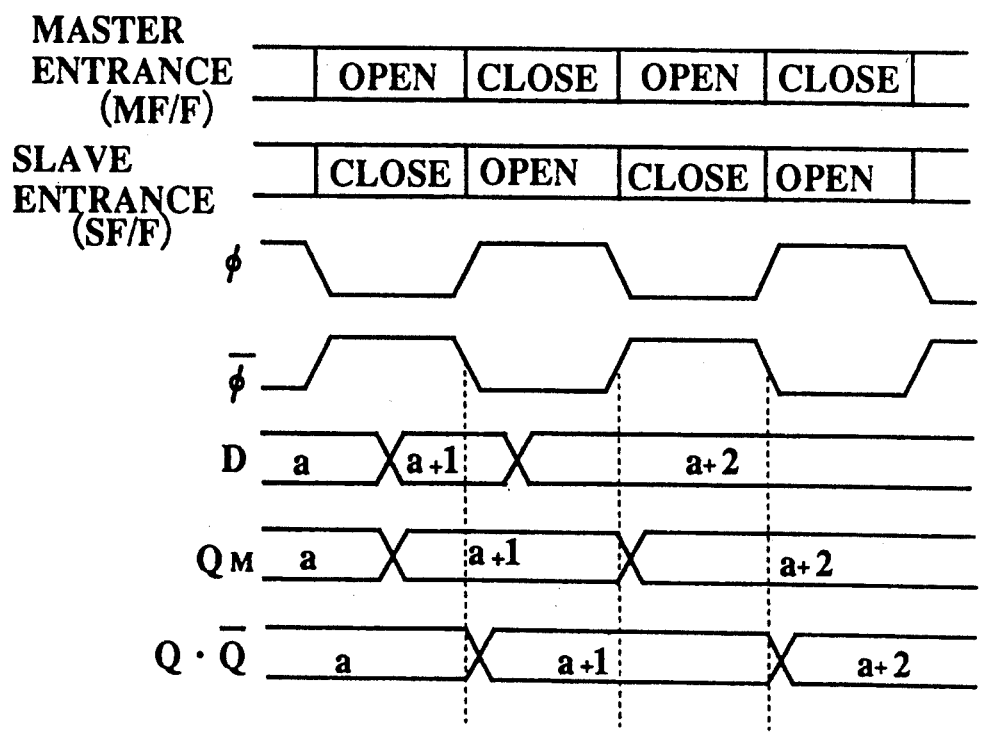

A master-slave type flip-flop (hereinafter referred to as the F/F) according to an embodiment of the invention will be explained with reference to FIG. 4.

A signal latch portion of a master circuit of the F/F comprises a pair of inverters 26 and 29 which are connected into a closed loop. A clocked inverter serving as a gate of the signal latch portion is incorporated in an input selecting portion disposed in front of the signal latch portion.

The input selecting portion comprises multiplexers 23, 24 and 25, each of which is connected in parallel with the inverters 26 and 29.

The multiplexer 23 comprises four p-type MOSFETs connected in series between a power source terminal and an output line to the inverters 26 and 29, and four n-type MOSFETs connected in series between the output line to the inverters 26 and 29 and a ground terminal. A data terminal D is connected to a gate of one of the p-type MOSFETs and to a gate of one of the n-type MOSFETs. When the other MOSFETs are all ON, an inverted data signal appears at an output terminal of the multiplexer 23 and is given to the F/F. The other terminals of the multiplexer 23 receive a clock signal φ, an enable signal E, a test enable signal T and their inverted signals. When T=0 and E=1, the multiplexer 23 acts as an inverter for receiving the data signal D and outputting the data signal when the clock signal rises. When T=1 or E=0, the output terminal of the multiplexer 23 is in a floating state.

Comparing the multiplexers 23 and 24 with each other, the data terminal of the multiplexer 23 corresponds to a test scan terminal of the multiplexer 24, the test enable and inverted test enable terminals of the multiplexer 23 to inverted test enable and test enable terminals of the multiplexer 24, and the MOSFETs connected to the enable and inverted enable terminals of the multiplexer 23 are omitted in the multiplexer 24. Namely, the multiplexer 24 comprises three p-type MOSFETs and three n-type MOSFETs. When T=1, the multiplexer 24 acts as an inverter for receiving a test scan signal S and providing the F/F with the test scan signal S at the timing of a rise of the clock signal.

The multiplexer 25 comprises four p-type MOSFETs and four n-type MOSFETs. When T=0 and E=0, the multiplexer 25 acts as an inverter for receiving a fed back signal Q which is an output signal of the F/F, and providing the F/F with the signal Q as an input signal at a rise of the clock signal.

Figure 4:
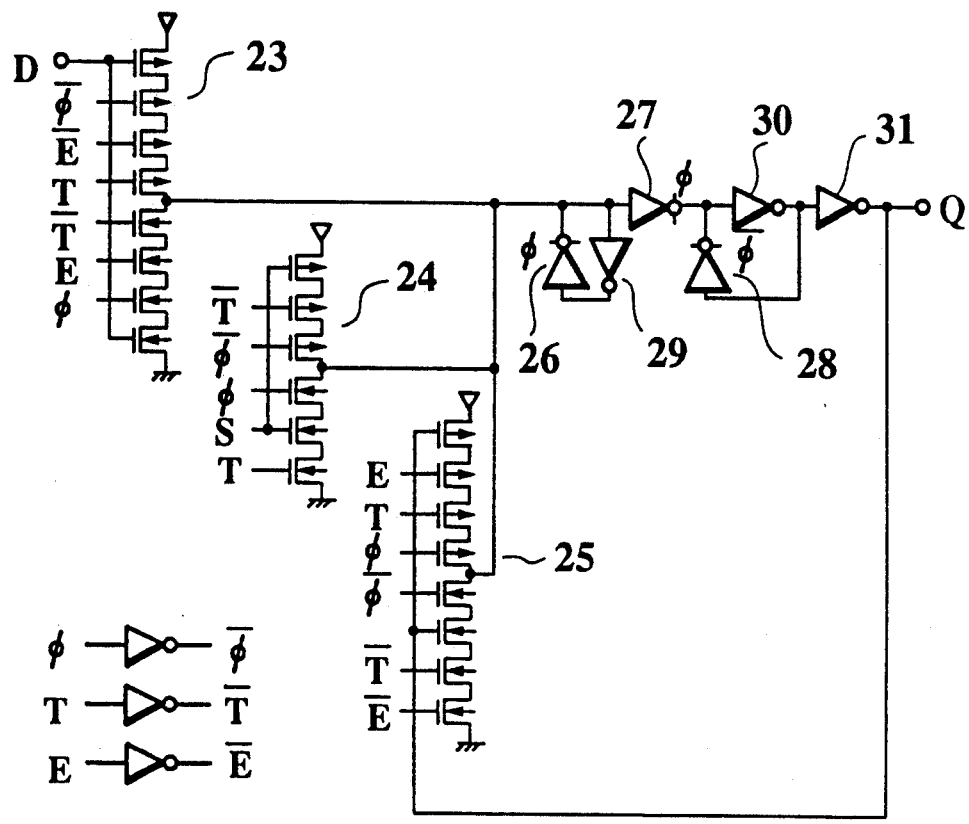
FIG. 4 is a circuit diagram showing a flip-flop with a scan path according to an embodiment of the invention.

Similar to the conventional F/F, the slave F/F of FIG. 4 comprises a pair of inverters 28 and 30 and an inverter 27 disposed in front of the inverters 28 and 30 to serve as a gate.

An operation of the embodiment will be explained.

When the test enable signal T=0 and enable signal E=1, the multiplexer 23 is selected to provide the F/F with data D, thereby achieving a normal operation.

When the test enable signal T=1, the multiplexer 24 is selected to provide the F/F with test data S, thereby achieving a test.

When the test enable signal T=0 and enable signal E=0, the multiplexer 25 is selected to provide the F/F with an output signal of the inverter 31, thereby achieving a feedback operation.

Figure 5:
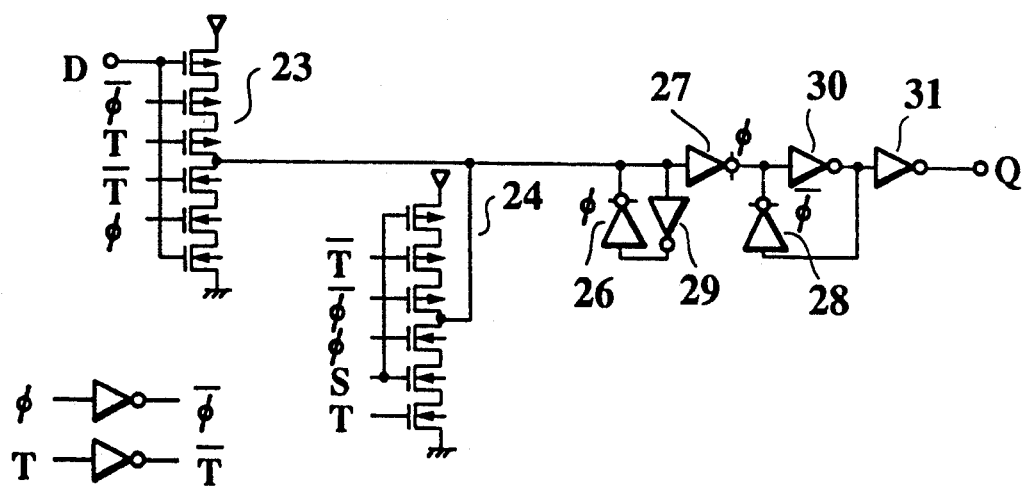
FIG. 5 is a circuit diagram showing a flip-flop with a scan path according to another embodiment of the invention.

Another embodiment of the invention will be explained with reference to FIG. 5.

Compared with the previous embodiment this embodiment does not have the multiplexer 25, i.e., the feedback portion nor the transistors to which the enable signal E is provided. The other parts thereof are the same as those of the embodiment of FIG. 4. An operation thereof is also the same as that of the embodiment of FIG. 4 except for the feedback operation.

In this way, the embodiments of the invention can reduce the number of gates arranged between the data input and the flip-flop, thereby shortening a setup time. The invention employs more series-connected transistors, thereby reducing a cell area. When applied to a higher speed microprocessor, the invention can reduce a delay between resisters, thereby improving an operation frequency and capacity of the microprocessor.

Various modifications will become possible for those skilled in the art after receiving the teachings of this disclosure without departing from the scope thereof.

What is claimed is:

1. A flip-flop with a scan path, comprising;
   a latch circuit;
   a first transistor of first conduction type connected between an input terminal of said latch circuit and a high-potential power source in series with other transistors, a gate of said first transistor receiving a data signal;
   a second transistor of second conduction type connected between the input terminal of said latch circuit and a low-potential power source in series with other transistors, a gate of said second transistor receiving the data signal;
   a third transistor connected in series with said first transistor between the input terminal of said latch circuit and the high-potential power source, a gate of said third transistor receiving one of a clock signal and an inverted clock signal:
   a fourth transistor connected in series with said second transistor between the input terminal of said latch circuit and the low-potential power source; a gate of said fourth transistor receiving the other of the clock signal and inverted clock signal; said third and fourth transistors being turned on and off in phase;
   a fifth transistor connected in series with said first and third transistors between the input terminal of said latch circuit and the high-potential power source, a gate of said fifth transistor receiving one of a test enable signal and an inverted test enable signal;

a sixth transistor connected in series with said second and fourth transistors between the input terminal of said latch circuit and the low-potential power source, a gate of said sixth transistor receiving the other of the test enable signal and inverted test enable signal, said fifth and sixth transistors being turned on and off in phase;

a seventh transistor of third conducting type connected in series with other transistors between the input terminal of said latch circuit and the high-potential power source, a gate of said seventh transistor receiving a test signal;

an eighth transistor of fourth conduction type connected in series with other transistors between the input terminal of said latch circuit and the low-potential power source, a gate of said eighth transistor receiving the test signal;

a ninth transistor connected in series with said seventh transistor between the input terminal of said latch circuit and the high-potential power source, a gate of said ninth transistor receiving one of the clock signal and inverted clock signal, said third and ninth transistors being turned on and off in phase;

a tenth transistor connected in series with said eighth transistor between the input terminal of said latch circuit and the low-potential power source, a gate of said tenth transistor receiving the other of the clock signal and inverted clock signal, said ninth and tenth transistors being turned on and off in phase;

an eleventh transistor connected in series with said seventh and ninth transistors between the input terminal of said latch circuit and the high-potential power source, a gate of said eleventh transistor receiving one of the test enable signal and inverted test enable signal, said fifth and eleventh transistors being turned on and off in opposite phases; and a twelfth transistor connected in series with said eighth and tenth transistors between the input terminal of said latch circuit and the low-potential power source, a gate of said twelfth transistor receiving the other of the test enable signal and inverted test enable signal, said eleventh and twelfth transistors being turned on and off in phase.

2. The flip-flop according to claim 1, wherein said latch circuit comprises an inverter and a clocked inverter whose inputs and outputs are connected to to each other, the output of the clocked inverter being the input of said latch circuit.

3. The flip-flop according to claim 1, further comprising a slave flip-flop connected to an output terminal of said latch circuit.

4. The flip-flop according to claim 3, wherein the slave flip-flop comprises a clocked inverter serving as a gate, and a latch circuit.

5. The flip-flop according to claim 4, wherein the latch circuit of the slave flip-flop comprises an inverter and a clocked inverter whose inputs and outputs are connected to each other, an output end of the clocked inverter serving as an input terminal of the latch circuit.

6. The flip-flop according to claim 1 further comprising:

a thirteenth transistor connected in series with said first, third and fifth transistors between the input terminal of said latch circuit and the high-potential power source, a gate of the thirteenth transistor receiving one of an enable signal and an inverted enable signal;

a fourteenth transistor connected in series with said second, fourth and sixth transistors between the input terminal of said latch circuit and the low potential power source, a gate of the fourteenth transistor receiving the other of the enable signal and inverted enable signal, the thirteenth and fourteenth transistors being turned on and off in phase;

a fifteenth transistor of fifth conduction type connected in series with other transistors between the input terminal of said latch circuit and the high-potential power source, a gate of the fifteenth transistor receiving an output signal of the flip-flop;

a sixteenth transistor of sixth conduction type connected series with other transistors between the input terminal of said latch circuit and the low-potential power source, a gate of the sixteenth transistor receiving the output signal of the flip-flop, the fifteenth and sixteenth transistors being turned on and off in opposite phases;

a seventeenth transistor connected in series with the fifteenth transistor between the input terminal of said latch circuit and the high-potential power source, a gate of the seventeenth transistor receiving one of the clock signal and inverted clock signal;

an eighteenth transistor connected in series with the sixteenth transistor between the input terminal of said latch circuit and the low-potential power source, a gate of the eighteenth transistor receiving the other of the clock signal and inverted clock signal;

a nineteenth transistor connected in series with the fifteenth and seventeenth transistors between the input terminal of said latch circuit and the high-potential power source, a gate of the nineteenth transistor receiving one of the test enable signal and inverted test enable signal, said fifth transistor and the nineteenth transistor being turned on and off in phase;

a twentieth transistor connected in series with the sixteenth and eighteenth transistors between the input terminal of said latch circuit and the low-potential power source, a gate of the twentieth transistor receiving the other of the test enable signal and inverted test enable signal; the nineteenth and twentieth transistors being turned on an off in phase;

a twenty-first transistor connected with the first, second and third transistors between the input terminal of said latch circuit and the high-potential power source, a gate of the twenty-first transistor receiving one of the enable signal and inverted enable signal, the fourteenth and twenty-first transistors being turned on and off in phase; and a twenty-second transistor connected with fourth, fifth and sixth transistor between the input terminal of said latch circuit and the low potential power source, a gate of the twenty-second transistor receiving the other of the enable signal and inverted enable signal, the twenty-first and twenty-second transistors being turned on and off in phase.

7. The flip-flop according to claim 6, wherein the seventeenth and eighteenth transistors and said third transistor are turned on and off in phase.

8. A flip-flop with a scan path, comprising:

a latch circuit which is a combinational circuit of an inverter and a clocked inverter whose inputs and outputs are connected with each other to form a closed loop;

three first MOSFETs connected in series between a power source terminal and an input terminal of the inverter of the combinational circuit, gate terminals of said three first MOSFETs being connected to a data terminal, one of a clock signal terminal and an inverted clock signal terminal, and one of a test enable signal terminal and an inverted test enable signal terminal, respectively;

three second MOSFETs connected in series between a ground terminal and the input terminal of the inverter of the combinational circuit, gate terminals of said three second MOSFETs being connected to the data terminal, the other of the clock signal terminal and inverted clock signal terminal, and the other of the test enable signal terminal and inverted test enable signal terminal, respectively;

three third MOSFETs connected in series between the power source terminal and the input terminal of the inverter of the combinational circuit, gate terminals of said three third MOSFETs being connected to a test scan terminal, one of the clock signal terminal and inverted clock signal terminal, and one of the test enable signal terminal and inverted test enable signal terminal, respectively; and three fourth MOSFETs connected in series between the ground terminal and the input terminal of the inverter of the combinational circuit, gate terminals of said three fourth MOSFETs being connected to the test scan terminal, the other of the clock signal terminal and inverted clock signal terminal, and the other of the test enable signal terminal and inverted test enable signal terminal, respectively.

9. The flip-flop according to claim 8, further comprising;

a fifth MOSFET connected in series with said three first MOSFETs between the power source terminal and the input terminal of the inverter of the combinational circuit, gate terminal of said fifth MOSFET being connected to one of the data enable signal terminal and inverted data enable signal terminal;

a sixth MOSFET connected in series with said three second MOSFETs between the ground terminal and the input terminal of the inverter of the combinational circuit, gate terminal of said sixth MOSFET being connected to the other of the data enable signal terminal and inverted data enable signal terminal;

three seventh MOSFETs connected in series between the power source terminal and the input terminal of the inverter of the combinational circuit, gate terminals of the three seventh MOSFETs being connected to an output terminal of the flip-flop, one of the clock signal terminal and inverted clock signal terminal, one of the test enable signal terminal and inverted test enable signal terminal, and one of the data enable terminal and inverted data enable terminal, respectively; and three eighth MOSFETs connected in series between the ground terminal and the input terminal of the inverter of the combinational circuit, gate terminals of the three eighth MOSFETs being connected to the output terminal of the flip-flop, the other of the clock signal terminal and the inverted clock signal terminal, the other of the test enable signal terminal and inverted test enable signal terminal, and the other of the data enable signal terminal and inverted data enable signal terminal, respectively.

* * * * *